United States Patent
Ok et al.

(10) Patent No.: US 11,201,092 B2
(45) Date of Patent: Dec. 14, 2021

(54) GATE CHANNEL LENGTH CONTROL IN VFET

(71) Applicant: International Business Machines Corporation, Armonk, NY (US)

(72) Inventors: Injo Ok, Loudonville, NY (US); Choonghyun Lee, Rensselaer, NY (US); Soon-Cheon Seo, Glenmont, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/366,516

(22) Filed: Mar. 27, 2019

(65) Prior Publication Data

US 2020/0312723 A1    Oct. 1, 2020

(51) Int. Cl.
| | |
|---|---|
| H01L 29/06 | (2006.01) |
| H01L 29/08 | (2006.01) |
| H01L 29/10 | (2006.01) |
| H01L 29/49 | (2006.01) |
| H01L 29/51 | (2006.01) |
| H01L 29/78 | (2006.01) |
| H01L 29/66 | (2006.01) |
| H01L 27/088 | (2006.01) |
| H01L 21/8234 | (2006.01) |
| H01L 21/28 | (2006.01) |

(52) U.S. Cl.
CPC .......... *H01L 21/823487* (2013.01); *H01L 21/28088* (2013.01); *H01L 21/823412* (2013.01); *H01L 21/823418* (2013.01); *H01L 21/823437* (2013.01); *H01L 21/823462* (2013.01); *H01L 21/823481* (2013.01); *H01L 27/088* (2013.01); *H01L 29/0649* (2013.01); *H01L 29/0847* (2013.01); *H01L 29/1037* (2013.01); *H01L 29/4966* (2013.01); *H01L 29/517* (2013.01); *H01L 29/66666* (2013.01); *H01L 29/7827* (2013.01)

(58) Field of Classification Search
CPC .................................................. H01L 29/66666
See application file for complete search history.

(56) References Cited

U.S. PATENT DOCUMENTS

| | | | |
|---|---|---|---|
| 9,437,503 B1 * | 9/2016 | Mallela | ............ H01L 29/66666 |
| 9,530,700 B1 | 12/2016 | Mallela et al. | |
| 9,685,537 B1 | 6/2017 | Xie et al. | |
| 9,711,618 B1 * | 7/2017 | Cheng | ............... H01L 29/66666 |
| 9,728,635 B1 | 8/2017 | Cheng et al. | |
| 9,780,197 B1 | 10/2017 | Xie et al. | |
| 9,806,153 B1 | 10/2017 | Cheng et al. | |
| 9,859,388 B1 | 1/2018 | Cheng et al. | |
| 9,899,515 B1 * | 2/2018 | Cheng | ................. H01L 29/0847 |
| 10,026,653 B2 | 7/2018 | Anderson et al. | |

(Continued)

*Primary Examiner* — Omar F Mojaddedi
(74) *Attorney, Agent, or Firm* — Scully, Scott, Murphy & Presser, P.C.; L. Jeffrey Kelly, Esq.

(57) ABSTRACT

A semiconductor structure is provided utilizing a cost effective method in which the vertical gate channel length is substantially the same for vertical field effect transistors (VFETs) that are present in a dense device region and an isolated device region. The VFETs have improved uniformity, device functionality and better yield. No additional lithographic process is used in making such a semiconductor structure.

10 Claims, 8 Drawing Sheets

(56) References Cited

U.S. PATENT DOCUMENTS

| | | |
|---|---|---|
| 10,153,367 B2 | 12/2018 | Cheng et al. |
| 2018/0138046 A1* | 5/2018 | Bentley ............. H01L 29/42392 |
| 2019/0103319 A1* | 4/2019 | Qi ........................ H01L 27/088 |
| 2020/0027981 A1* | 1/2020 | Park .................... H01L 29/0649 |

* cited by examiner

GATE CHANNEL LENGTH CONTROL IN VFET

BACKGROUND

The present application relates to a semiconductor structure and a method of forming the same. More particularly, the present application relates to a semiconductor structure in which a substantially same vertical gate channel length is provided for each vertical field effect transistor (VFET) that is present in both a dense device region and an isolated device region of a semiconductor substrate.

Conventional VFETs are devices where the source-drain current flows in a direction normal to the substrate surface. In such devices, a vertical semiconductor fin (or pillar) defines the channel with the source and drain located at opposing ends of the semiconductor fin (or pillar). VFETs are an attractive option for technology scaling for beyond 7 nm technologies, and have potential advantages over conventional FinFETs in terms of density, performance, power consumption and integration.

In fabricating VFETs, a work function metal etch is typically used to define the vertical channel length of the VFETs. In a typical fabrication process, the work function metal is recessed everywhere on the semiconductor substrate utilizing an isotropic etch. However, there is a pattern loading issue as the recessing is done on the semiconductor fins (or pillars) because the fin (or pillar) pitch is not the same in all device regions. Thus, VFETs having different vertical gate channel lengths are provided in dense device regions and isolated device regions of the semiconductor substrate. Such VFETs can have uniformity issues, device functionality issues and/or yield issues.

SUMMARY

A semiconductor structure is provided utilizing a cost effective method in which the vertical gate channel length is substantially the same for vertical field effect transistors (VFETs) that are present in a dense device region and an isolated device region. The VFETs have improved uniformity, device functionality and/or better yield. No additional lithographic process is used in making such a semiconductor structure.

In one aspect of the present application, a semiconductor structure is provided. In one embodiment, the semiconductor structure includes a first VFET including a first gate structure having a first vertical gate channel length and contacting a sidewall of each semiconductor material structure that is present in a dense device region of a semiconductor substrate. A second VFET is present that includes a second gate structure having a second vertical gate channel length substantially equal to the first vertical gate channel length and contacting a sidewall of each semiconductor material structure that is present in an isolated device region of the semiconductor substrate.

In another aspect of the present application, a method of forming a semiconductor structure is provided. In one embodiment, the method includes forming a plurality of semiconductor material structures located in a dense device region and at least one semiconductor material structure located in an isolated device region of a semiconductor structure. A high-k gate dielectric material layer and a work function metal layer are then formed on at least sidewalls and atop each semiconductor material structure present in the dense device region and the isolated device region. A recessed first sacrificial material is formed on the work function metal layer and in gaps located between each semiconductor material structure present in the dense device region and the isolated device region, wherein the recessed first sacrificial material that is present in the gaps between each semiconductor material structure in the dense device region has a vertical height that is greater than a vertical height of the recessed first sacrificial material present in the isolated device region. Next, physically exposed portions of the work function metal layer and the high-k gate dielectric material layer not protected by the recessed first sacrificial material are removed to provide a work function metal liner and a high-k gate dielectric material liner in the gaps between each semiconductor material structure in the dense device region, and a second work function metal portion and a second high-k gate dielectric material portion present in the isolated device region. In accordance with the present application, the work function metal liner has a vertical height that is greater than a vertical height of the second work function metal portion. The vertical height of the work function metal liner and the high-k gate dielectric material liner are then adjusted to provide a first work function metal portion and a first high-k gate dielectric material portion in the gaps between each semiconductor material structure in the dense device region. In accordance with the present application, the first work function metal portion has a vertical height that is substantially the same as the vertical height of the second work function metal portion.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
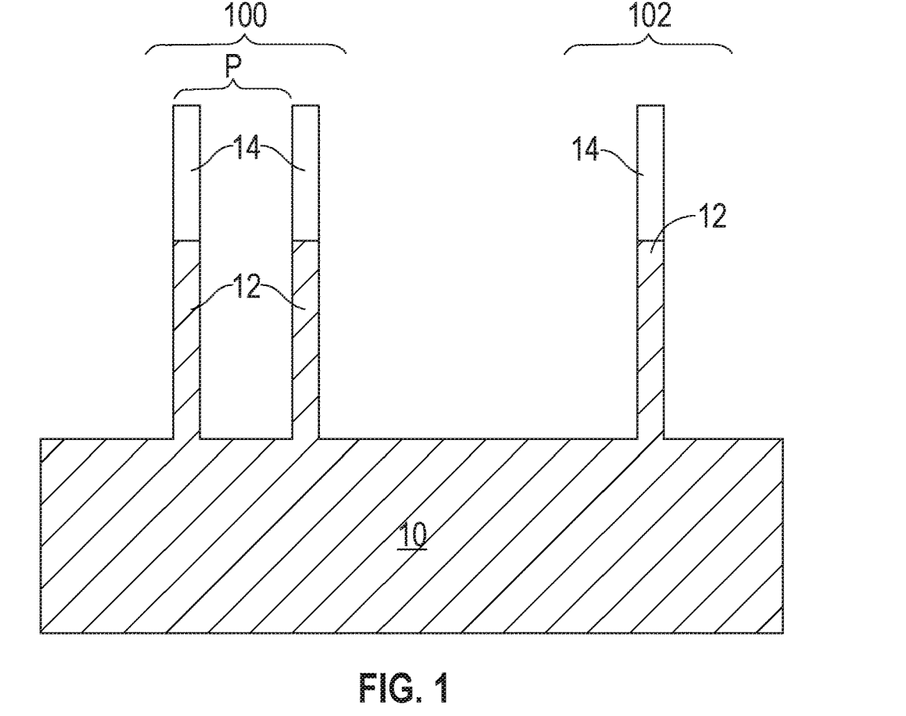
FIG. 1 is a cross sectional view of an exemplary semiconductor structure in accordance with the present application and during an early stage of fabrication, wherein the semiconductor structure includes a plurality of semiconductor material structures located in a dense device region and at least one semiconductor material structure located in an isolated device region.

Referring first to FIG. 1, there is illustrated an exemplary semiconductor structure in accordance with the present application and during an early stage of fabrication. Notably, the exemplary semiconductor structure of FIG. 1 includes a plurality of semiconductor material structures 12 located in a dense device region 100 and at least one semiconductor material structure 12 located in an isolated device region 102. As is shown, each semiconductor material structure 12 has a dielectric hard mask cap 14 located on a topmost surface thereof. An opening or gap is present between each semiconductor material structure 12. In accordance with the present application, the gap(s) between the semiconductor material structures 12 present in the dense device region 100 is(are) much smaller than the gap(s) between the semiconductor material structures 12 that is(are) present in the isolated device region 102. The semiconductor material structures 12 serve as vertical channel materials of the VFETs that are to be subsequently formed in the dense device region 100 and the isolated device region 102.

In FIG. 1, and by way of one example, two semiconductor material structures 12 are shown in the dense device region 100, and only a single semiconductor material structure 12 is shown in the isolated device region 102. In some embodiments, greater than two semiconductor material structures 12 can be present in the dense device region 100, and greater than one semiconductor material structure 12 can be present in the isolated device region 102. The dense device region 100 is a region of the semiconductor substrate 10 in which each semiconductor material structure 12 is spaced apart from its nearest neighboring semiconductor material structure 12 by a pitch, P, from 20 nm to 100 nm; the pitch is measured from one point of one semiconductor material structure 12 to the exact point on a nearest neighboring semiconductor material structure 12. The isolated device region 102 is a region of the semiconductor substrate 10 in which each semiconductor material structure 12 is spaced apart from its nearest neighboring semiconductor material structure 12 by a pitch of greater than 100 nm.

In one embodiment, each semiconductor material structure 12 is a semiconductor fin. As used herein, a "semiconductor fin" refers to a semiconductor structure including a pair of vertical sidewalls that are parallel to each other. As used herein, a surface is "vertical" if there exists a vertical plane from which the surface does not deviate by more than three times the root mean square roughness of the surface. In such an embodiment, each semiconductor fin can have a height from 15 nm to 100 nm, a length from 20 nm to 50 nm, and a width from 3 nm to 15 nm. Other semiconductor fin heights and/or widths that are lesser than, or greater than, the ranges mentioned herein can also be used in the present application. Each semiconductor fin is oriented parallel to each other.

In another embodiment, each semiconductor material structure 12 is a semiconductor pillar. As used herein, a "semiconductor pillar" refers to a semiconductor structure which is similar (in terms of height and width) to a semiconductor fin except that the length of the semiconductor pillar is much less than the length of a semiconductor fin. In one embodiment, the length of the semiconductor pillar is from 3 nm to 15 nm.

The semiconductor substrate 10 can be composed of a remaining portion of a base semiconductor substrate (not shown). The semiconductor substrate 10 can be composed of one or more semiconductor materials having semiconducting properties. Examples of semiconductor materials that can provide the semiconductor substrate 10 include silicon (Si), germanium (Ge), silicon germanium alloys (SiGe), silicon carbide (SiC), silicon germanium carbide (SiGeC), III-V compound semiconductors or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

Each semiconductor material structure 12 can be composed of one of the semiconductor materials mentioned above for the semiconductor substrate 10. In one embodiment, the semiconductor material structures 12 and the semiconductor substrate 10 are composed entirely of a same semiconductor material. In such an embodiment, no material interface is present between the semiconductor material structures 12 and the semiconductor substrate 10. In one example, the semiconductor material structures 12 and the semiconductor substrate 10 are composed entirely of silicon. In another embodiment, the semiconductor material structures 12 are composed of a different semiconductor material than the semiconductor substrate 10. In such an embodiment, a material interface would exist between the bottommost surface of each semiconductor material structure 12 and the topmost surface of the semiconductor substrate 10. In one example, the semiconductor material structures 12 are composed of a silicon germanium alloy or a III-V compound semiconductor, while the semiconductor substrate 10 is composed of silicon.

Each dielectric hard mask cap 14 is composed of a dielectric hard mask material such as, for example, silicon dioxide, silicon nitride and/or silicon oxynitride. In one example, silicon nitride is employed as the dielectric hard mask material of each dielectric hard mask cap 14. As is shown, the dielectric hard mask cap 14 has sidewall surfaces that are vertically aligned to sidewall surfaces of one of the underlying semiconductor material structures 12.

The exemplary semiconductor structure of FIG. 1 can be formed by first providing a dielectric hard mask layer (not shown) onto a surface of a base semiconductor substrate (not shown). The base semiconductor substrate is typically a bulk semiconductor substrate. By "bulk" it is meant that the base semiconductor substrate is entirely composed of at least one semiconductor material having semiconducting properties. The base semiconductor substrate can include at least one of the semiconductor materials mentioned above for semiconductor substrate 10, and the hard mask layer can include one of the dielectric hard mask materials mentioned above for the dielectric hard mask caps 14.

The dielectric hard mask layer can be formed utilizing a deposition process such as, for example, chemical vapor deposition (CVD) or plasma enhanced chemical vapor deposition (PECVD). In some embodiments, the dielectric hard mask layer can be formed by a thermal growth process such as, for example, thermal oxidation and/or thermal nitridation. In yet other embodiments, the dielectric hard mask layer can be formed utilizing a combination of, and in any order, a deposition process and a thermal growth process. The dielectric hard mask layer is a continuous layer (without any breaks or gaps) whose thickness can be from 20 nm to 100 nm. Other thicknesses that are lesser than, or greater than the aforementioned thicknesses values can also be employed as the thickness of the dielectric hard mask layer.

The dielectric hard mask layer and an upper semiconductor material portion of the base semiconductor substrate are then patterned to provide the exemplary semiconductor structure shown in FIG. 1. After patterning and in some embodiments, unwanted dielectric hard mask capped semiconductor material structures can be removed from the isolated device region 102 utilizing techniques well-known to those skilled in the art.

In one embodiment, the patterning of the dielectric hard mask layer and the upper semiconductor material portion of the base semiconductor substrate can include lithography and etching. The lithographic process includes forming a photoresist (not shown) atop a material or material stack to be patterned, exposing the photoresist to a desired pattern of radiation, and developing the exposed photoresist utilizing a conventional resist developer. The photoresist can be a positive-tone photoresist, a negative-tone photoresist or a hybrid-tone photoresist. The etching process (i.e., pattern transfer etch) includes a dry etching process (such as, for example, reactive ion etching, ion beam etching, plasma etching or laser ablation), and/or a wet chemical etching process. In some embodiments, the patterned photoresist is removed from the structure immediately after the pattern has been transferred into the dielectric hard mask layer. In other embodiments, the patterned photoresist is removed from the structure after the pattern has been transferred into both the dielectric hard mask layer and the upper semiconductor material portion of the base semiconductor substrate. In either embodiment, the patterned photoresist can be removed utilizing a conventional photoresist stripping process such as, for example, ashing.

In another embodiment, the patterning of the dielectric hard mask layer and the upper semiconductor material portion of the base semiconductor substrate can include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) can be composed of amorphous silicon or polysilicon. In another embodiment, the mandrel material layer (not shown) can be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer (not shown) on each sidewall of each mandrel structure. The spacer can be formed by deposition of a spacer material and then etching the deposited spacer material. The spacer material can comprise any material having an etch selectivity that differs from the mandrel material. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

In yet a further embodiment, the patterning of the dielectric hard mask layer and the upper semiconductor material portion of the base semiconductor substrate can include a direct self-assembly (DSA) process in which a copolymer that is capable of direct self-assembly is used. Other well known patterning process can also be used in forming the semiconductor material structures 12.

Figure 2:
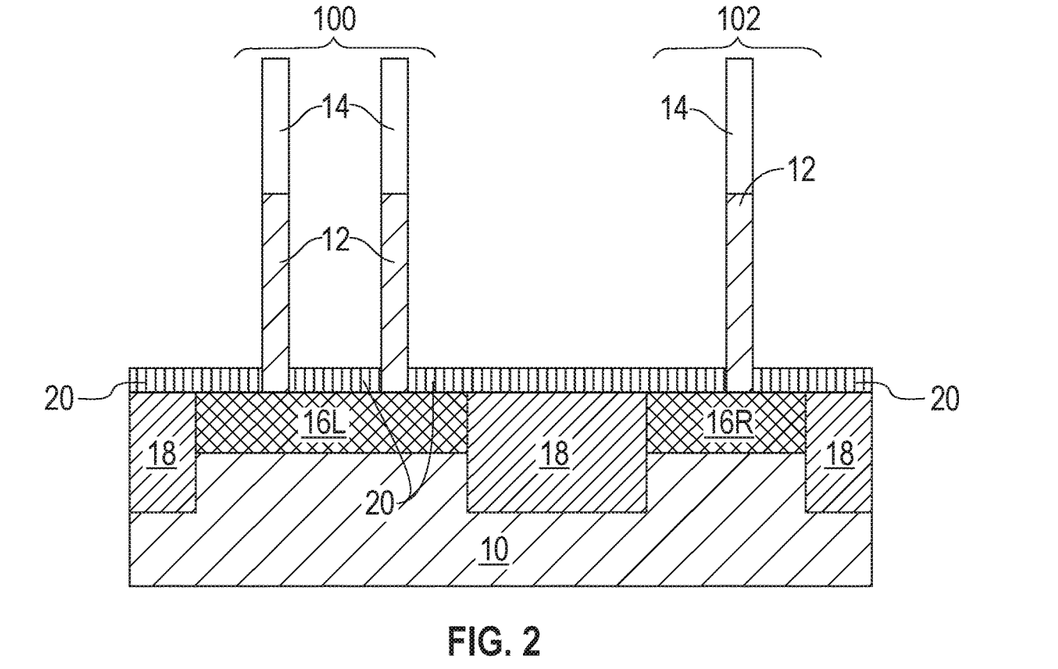
FIG. 2 is a cross sectional view of the exemplary semiconductor structure of FIG. 1 after forming a bottom source/drain (S/D) structure beneath each semiconductor material structure, and forming a bottom spacer layer laterally adjacent to a lower portion of each semiconductor material structure.

Referring now to FIG. 2, there is illustrated the exemplary semiconductor structure of FIG. 1 after forming a bottom source/drain (S/D) structure (16L, 16R) beneath each semiconductor material structure 12, and forming a bottom spacer layer 20 laterally adjacent to a lower portion of each semiconductor material structure 12. An isolation structure 18 may be formed in the semiconductor substrate 10. After forming the bottom S/D structures 16L/16R, and as is shown in FIG. 2, the semiconductor material structures 12 extends upward from a respective bottom S/D structure 16L/16R.

In the present application, element 16L designates the bottom S/D structure under the semiconductor material structures 12 that are present in the dense device region 100, while element 16R designates the bottom S/D structure under the semiconductor material structure(s) 12 present in the isolated device region 102. In some embodiments, bottom S/D structure 16L present in the dense device region 100 is of the same conductivity type as the bottom S/D structure 16R present in the isolated device region 102. In other embodiments, bottom S/D structure 16L present in the dense device region 100 is of a different conductivity type than the bottom S/D structure 16R present in the isolated device region 102.

The bottom S/D structure 16L/16R, the bottom spacer layer 20, and the isolation structure 18 can be formed utilizing techniques that are well-known to those skilled in the art. In one example, the bottom S/D structure 16L/16R, the bottom spacer layer 20, and the isolation structure 18 can be formed by first forming a sacrificial liner (not shown) on each physically exposed sidewall of each dielectric hard mask capped semiconductor material structure (14/12). The sacrificial liner is composed of a dielectric material such as, for example, silicon dioxide, silicon nitride, or silicon oxynitride. In some embodiments, the dielectric material that provides the sacrificial liner is compositionally different from the dielectric hard mask material that provides each dielectric hard mask cap 14. In other embodiments, the dielectric material that provides the sacrificial liner is compositionally the same as the dielectric hard mask material that provides each dielectric hard mask cap 14. The sacrificial liner can be formed by depositing a dielectric material and then subjecting the dielectric material to an anisotropic etch such as, for example, reactive ion etching, that is selective in removing the dielectric material that provides the sacrificial liner from all horizontal surfaces of the exemplary structure shown in FIG. 1. When the sacrificial liner and the dielectric hard mask cap 14 are composed of a compositionally same dielectric material, then an upper portion of the dielectric hard mask cap 14 can be removed during the anisotropic etch employed in forming the sacrificial liner. The dielectric material that provides the sacrificial liner can be deposited by, for example, chemical vapor deposition (CVD) or plasma enhanced chemical vapor deposition (PECVD). The sacrificial liner can have a width, as measured from one sidewall to an opposing sidewall, from 2 nm to 10 nm; although other widths are possible and are not excluded from being used as width of the sacrificial liner.

Next, a bottom S/D region (not shown) is formed at the footprint of each semiconductor material structure 12 and laterally adjacent to, and contacting, a mesa portion (not shown) of the semiconductor substrate 10. In one embodiment, the bottom S/D region (not shown) can be formed utilizing an angled ion implantation process in which an n-type dopant or a p-type dopant, as defined herein below, are introduced into the semiconductor substrate 10. In such a process, a block mask can be used to protect one device region, while processing the other device region to include the bottom S/D region. The block mask is removed, and then another block mask is formed over the processed device region, while the non-processed device region is processed to include the other bottom S/D region.

In another embodiment, the bottom S/D region (not shown) can be formed by forming a trench at the footprint of each semiconductor material structure 12, and then epitaxially filling the trench with a doped semiconductor material. The doped semiconductor material may be an n-type doped semiconductor material or a p-type doped semiconductor material. When different conductivity type VFETs are to be formed in the two device regions 100, 102, a block mask can be used to protect one device region, while processing the other device region to include the bottom S/D region. The block mask is removed, and then another block mask is formed over the processed device region, while the non-processed device region is processed to include the other bottom S/D region.

In the present application, the terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The epitaxial growth can be performed at a temperature of from 300° C. to 800° C. The epitaxial growth can be performed utilizing any well known precursor gas or gas mixture. Carrier gases like hydrogen, nitrogen, helium and argon can be used. A dopant (n-type or p-type, as defined below) is typically added to the precursor gas or gas mixture.

The semiconductor material that can be epitaxially deposited in this embodiment includes, but is not limited to, silicon (Si), germanium (Ge), silicon germanium alloys (SiGe), silicon carbide (SiC), silicon germanium carbide (SiGeC), III-V compound semiconductors or II-VI compound semiconductors. In some embodiments, the semiconductor material that can be epitaxially deposited in this embodiment is composed of silicon. The semiconductor material that can be epitaxially deposited in this embodiment can be compositionally the same as, or compositionally different from, each of the semiconductor material structures 12 and/or semiconductor substrate 10.

The term "n-type" refers to the addition of impurities that contributes free electrons to an intrinsic semiconductor. In a silicon containing semiconductor material, examples of n-type dopants, i.e., impurities, include, but are not limited to, antimony, arsenic and phosphorous. The concentration of n-type dopant within the semiconductor material that provides the bottom S/D region can range from $1 \times 10^{18}$ atoms/$cm^3$ to $1 \times 10^{21}$ atoms/$cm^3$, although dopant concentrations greater than $1 \times 10^{21}$ atoms/$cm^3$ or less than $1 \times 10^{18}$ atoms/$cm^3$ are also conceived.

The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium. The concentration of p-type dopant within the semiconductor material that provides the bottom S/D region can range from $1 \times 10^{18}$ atoms/$cm^3$ to $1 \times 10^{21}$ atoms/$cm^3$, although dopant concentrations greater than $1 \times 10^{21}$ atoms/$cm^3$ or less than $1 \times 10^{18}$ atoms/$cm^3$ are also conceived.

In some embodiments, isolation structure 18 can be formed. The isolation structure 18 can be formed by forming a trench opening in the semiconductor substrate 10, and then filling the trench opening with a trench dielectric material such as, for example, silicon dioxide. A recess etch may follow the trench filling step. The isolation structure 18 can be formed either prior to or after forming the bottom S/D region.

The sacrificial liner can now be removed from each semiconductor material structure 12. The sacrificial liner can be removed from each semiconductor material structure 12 utilizing an etching process that is selective in removing the sacrificial liner. A portion of each dielectric hard mask 14 may, or may not, be removed during the sacrificial liner removal.

The bottom spacer layer 20 can now be formed. The bottom spacer layer 20 has a sidewall that directly contacts a lower portion of a sidewall of each of the semiconductor material structures 12. The bottom spacer layer 20 can be composed of any dielectric spacer material including, for example, silicon dioxide, silicon nitride, or silicon oxynitride. The bottom spacer layer 20 can be formed utilizing a deposition process such as, for example, chemical vapor deposition or plasma enhanced chemical vapor deposition. In some instances, an etch back process may follow the deposition of the dielectric spacer material that provides the bottom spacer layer 20. The bottom spacer layer 20 can have a thickness that are from 5 nm to 15 nm. Other thicknesses that are lesser than, or greater than, the aforementioned thickness range can also be employed in the present application as the thickness of the bottom sacrificial spacer 20 as long as the height of the bottom spacer layer 20 is not greater than the height of the semiconductor material structures 12.

A drive-in anneal can now be performed to provide the bottom S/D structures 16L/16R. The drive-in anneal causes diffusion of dopants (n-type or p-type) from the bottom S/D region into the mesa portion of the semiconductor substrate 10. In some embodiments, the drive-anneal may be formed prior to forming the bottom spacer layer 20, or any other time after formation of the bottom S/D region. Diffusion of dopants (n-type or p-type) into the semiconductor substrate 10 that is located beneath the bottom S/D region also occurs during this drive-in anneal. The drive-in anneal can be performed at a temperature from 850° C. or greater. In one example, the drive-in anneal is performed at a temperature from 950° C. to 1050° C. The drive-in anneal can include laser annealing, flash annealing, rapid thermal annealing (RTA) or any suitable combination thereof.

In one embodiment, the bottom S/D structure 16L present in the dense device region 100 and the bottom S/D structure 16R present in the isolated device region 102 are bottom nFET S/D structures composed of a semiconductor material as defined above and an n-type dopant as defined above, or bottom pFET S/D structures composed of a semiconductor material as defined above and a p-type dopant as defined above. In another embodiment, the bottom S/D structure 16L present in the dense device region 100 may be a bottom nFET S/D structure composed of a semiconductor material as defined above and an n-type dopant as defined above, while the bottom S/D structure 16R present in the isolated device region 102 may be a bottom pFET S/D structure composed of a semiconductor material as defined above and a p-type dopant as defined above. In yet a further embodiment, the bottom S/D structure 16L present in the dense device region 100 may be a bottom pFET S/D structure composed of a semiconductor material as defined above and p-type dopant as defined above, while the bottom S/D structure 16R present in the isolated device region 102 may be a bottom nFET S/D structure composed of a semiconductor material as defined above and an n-type dopant as defined above.

Figure 3:
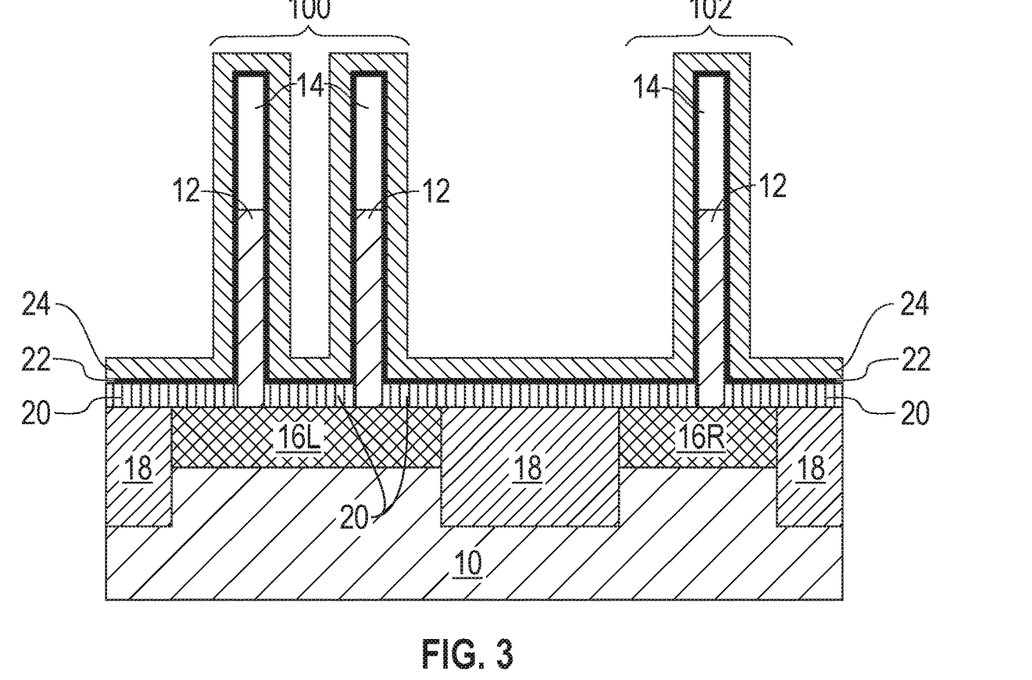
FIG. 3 is a cross sectional view of the exemplary semiconductor structure of FIG. 2 after forming a high-k gate dielectric material layer and a work function metal layer.

Referring now to FIG. 3, there is illustrated the exemplary semiconductor structure of FIG. 2 after forming a high-k gate dielectric material layer 22 and a work function metal layer 24. The high-k gate dielectric material layer 22 is formed on physically exposed surfaces of the exemplary semiconductor structure shown in FIG. 2 including the physically exposed topmost surface of the bottom spacer layer 20, the physically exposed sidewall of each semiconductor material structure 12, and the physically exposed sidewall and topmost surface of each dielectric hard mask cap 14. The work function metal layer 24 is formed on the high-k gate dielectric material layer 22. The high-k gate dielectric material layer 22 and the work function metal layer 24 partially fill in the gaps that are located between each semiconductor material structure 12. Collectively, the high-k gate dielectric material layer 22 and the work function metal layer 24 are used in providing the gate structure of the VFET.

In the illustrated embodiment, the dense device region 100 and the isolated device region 102 share a common work function metal layer 24. In some embodiments (not shown), the dense device region 100 contains a different work function metal layer than the isolated device region 102. In such an embodiment, a first work function metal layer is formed in both the dense device region 100 and the isolated device region 102. A block mask is then formed in one device region, and the first work function metal layer is removed from the other device region not including the block mask. A second work function metal layer that is different from the first work function metal layer is then formed in the device region in which the first work function metal layer was removed. In such an embodiment, the first and second work function metal layers can contact each other over the isolation structure 18 that is present between the dense device region 100 and the isolated device region 102.

The term "high-k gate dielectric material" denotes a gate dielectric material having a dielectric constant greater than 4.0; all dielectric constants mentioned herein are measured in a vacuum. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiON$, $SiN_x$, a silicate thereof, and an alloy thereof. Each value of x is independently from 0.5 to 3 and each value of y is independently from 0 to 2. The high-k gate dielectric material layer 22 can be formed by any deposition process including, for example, chemical vapor deposition (CVD), plasma enhanced chemical vapor deposition (PECVD), physical vapor deposition (PVD), sputtering, or atomic layer deposition (ALD). In one embodiment of the present application, the high-k gate dielectric material layer 22 can have a thickness in a range from 1 nm to 10 nm. Other thicknesses that are lesser than, or greater than, the aforementioned thickness range can also be employed for high-k gate dielectric material layer 22. The high-k gate dielectric material layer 22 typically has a conformal thickness. The term "conformal" denotes that a material layer has a vertical thickness along horizontal surfaces that is substantially the same (i.e., within ±5%) as the lateral thickness along vertical surfaces.

In some embodiments (not shown), an interfacial dielectric material layer can be formed prior to forming the high-k gate dielectric material layer 22. When present, the interfacial dielectric material layer is composed of silicon dioxide. The interfacial dielectric material layer can be formed utilizing a thermal oxidation (i.e., growth) process. The interfacial dielectric material layer can have a thickness from 0.5 nm to 2.0 nm.

In some embodiments, the work function metal layer 24 is an n-type work function metal that effectuates an n-type threshold voltage shift. "N-type threshold voltage shift" as used herein means a shift in the Fermi energy of an n-type semiconductor device towards a conduction band of silicon in a silicon-containing material of the n-type semiconductor device. The "conduction band" is the lowest lying electron energy band of the doped material that is not completely filled with electrons. In one embodiment, the work function of the n-type work function metal ranges from 4.1 eV to 4.3 eV.

In one embodiment, the n-type work function metal is composed of at least one of titanium aluminum, titanium aluminum carbide, tantalum nitride, titanium nitride, hafnium nitride, hafnium silicon, or combinations and thereof. The n-type work function metal can be a single material layer or a multi-material layer.

In some embodiments, the work function metal layer 24 is a p-type work function metal that effectuates a p-type threshold voltage shift. In one embodiment, the work function of the p-type work function metal ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing material of the p-type semiconductor device. A "valence band" is the highest range of electron energies where electrons are normally present at absolute zero.

In one embodiment, the p-type work function metal can be composed of titanium and its nitride or carbide. In one specific embodiment, the p-type work function metal is composed of titanium nitride. The p-type work function metal can also be composed of titanium aluminum nitride, tantalum nitride, ruthenium, platinum, molybdenum, cobalt, and alloys and combinations or thereof. The p-type work function metal can be a single material layer or a multi-material layer.

The work function metal layer 24 can be formed utilizing a deposition process such as, for example, chemical vapor deposition (CVD), plasma enhanced chemical vapor deposition (PECVD), physical vapor deposition (PVD), sputtering, or atomic layer deposition (ALD). In one embodiment, the work function metal layer 24 can have a thickness in a range from 1 nm to 10 nm. Other thicknesses that are lesser than, or greater than, the aforementioned thickness range can also be employed for each of work function metal layer 24. The work function metal layer 24 typically has a conformal thickness.

Figure 4:
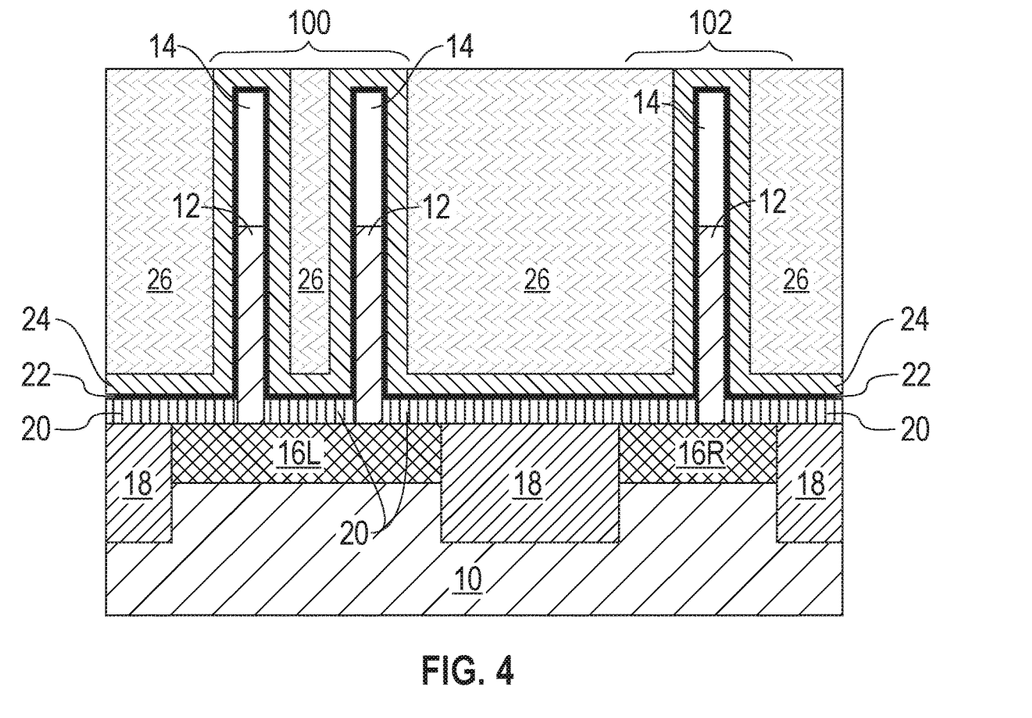
FIG. 4 is a cross sectional view of the exemplary semiconductor structure of FIG. 3 after forming a first sacrificial material on the work function metal layer and in gaps located between each semiconductor material structure.

Referring now to FIG. 4, there is illustrated the exemplary semiconductor structure of FIG. 3 after forming a first sacrificial material 26 in the gaps located between each semiconductor material structure 12 and on the surface of the work function metal layer 24. At this point of the present application, and as is shown in FIG. 4, the first sacrificial material 26 typically has a topmost surface that is coplanar with a topmost surface of the work function metal layer 24 that is present on each of the dielectric hard mask caps 14.

The first sacrificial material 26 can include any dielectric material that has an etch selectivity that differs from the dielectric hard mask caps 14 and the high-k gate dielectric material layer 22. In one example, the first sacrificial material 26 is composed of an organic planarization layer (OPL). In other example, the first sacrificial material 26 is composed of a organic dielectric layer (ODL). The first sacrificial material 26 can be formed utilizing a conventional deposition process including, for example, chemical vapor deposition (CVD), plasma enhanced chemical vapor deposition (PECVD) or spin-on coating. In some embodiments, a planarization process such as, for example, chemical mechanical polishing (CMP) may follow the deposition of the dielectric material that provides the first sacrificial material 26.

Figure 5:
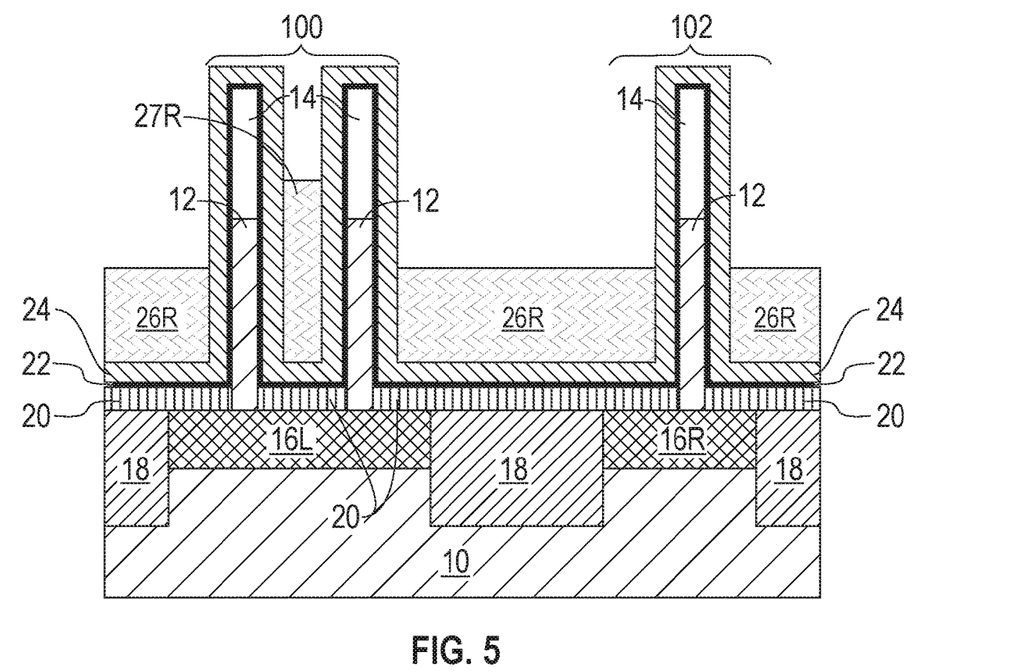
FIG. 5 is a cross sectional view of the exemplary semiconductor structure of FIG. 4 after recessing the first sacrificial material.

Referring now to FIG. 5, there illustrated the exemplary semiconductor structure of FIG. 4 after recessing the first sacrificial material 26. The recessing of the first sacrificial material 26 is performed utilizing a recess etching process that is selective in removing a portion, but not an entirety of, the first sacrificial material 26.

After recessing of the first sacrificial material 26, a portion of the first sacrificial material 26 remains in the dense device region 100 and the isolated device region 102. Due to a loading effect, the portion of the first sacrificial material 26 that remains in the gaps between each of the semiconductor material structures 12 in the dense device region 100 has a vertical height that is greater than a vertical height of the portion of the first sacrificial material 26 that remains in the isolated device region 102. The portion of the first sacrificial material 26 that remains in the gaps between each of the semiconductor material structures 12 in the dense device region 100 can be referred to a dense device region first sacrificial material portion 27R, while the portion of the first sacrificial material 26 that remains in the isolated device region 102 may be referred to an isolated device region first sacrificial material portion 26R. In accordance with the present application, the vertical height of the dense device region first sacrificial material portion 27R is greater than the vertical height of the isolated device region first sacrificial material portion 26R.

Figure 6:
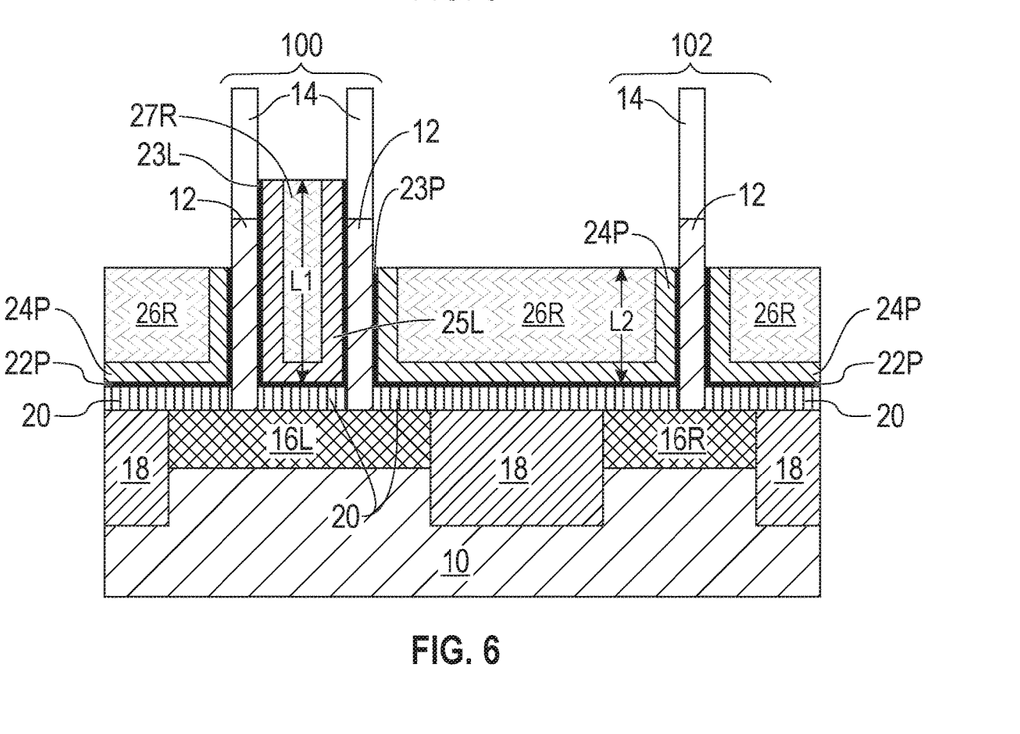
FIG. 6 is a cross sectional view of the exemplary semiconductor structure of FIG. 5 after removing physically exposed portions of the work function metal layer and the gate dielectric material layer not protected by the recessed first sacrificial material.

Referring now to FIG. 6, there is illustrated the exemplary semiconductor structure of FIG. 5 after removing physically exposed portions of the work function metal layer 24 and the gate dielectric material layer 22 not protected by the recessed first sacrificial material (26R, 27R).

The removal of the physically exposed portions of the work function metal layer 24 and the gate dielectric material layer 22 not protected by the recessed first sacrificial material (26R, 27R) can be performed utilizing one or more isotropic etching process. In one example, one or more reactive ion etching processes can be used to remove the physically exposed portions of the work function metal layer 24 and the gate dielectric material layer 22 not protected by the recessed first sacrificial material (26R, 27R). The recessed first sacrificial material (26R, 27R) acts as an etch mask during this step of the present application.

Portions of the work function metal layer 24 and the high-k gate dielectric material layer 22 remain after this removal step. The portion of the work function metal layer 24 that remains beneath the dense device region first sacrificial material portion 27R may be referred to as a work function metal liner 25L, while the portion of the work function metal layer 24 that remains beneath the isolated device region first sacrificial material portion 26R may be referred to as a second work function metal portion 24P. The work function metal liner 25L will be subsequently processed into a first work function metal portion. The portion of the high-k gate dielectric material layer 22 that remains beneath the dense device region first sacrificial material portion 27R may be referred to as a first high-k gate dielectric material liner 23L, while the portion of the high-k gate dielectric material layer 22 that remains beneath the isolated device region first sacrificial material portion 26R may be referred to as a second high-k gate dielectric material portion 22P. The first high-k gate dielectric material liner 23L will be subsequently processed into a first high-k gate dielectric material portion.

As is shown, the work function metal liner 25L and the high-k gate dielectric material liner 23L that are located in the gaps between the semiconductor material structures 12 that are present in the dense device region 100 are U-shaped and have topmost surfaces that are coplanar with each other as well as coplanar with the dense device region first sacrificial material portion 27R. As is further shown, the second work function metal portion 24P and the second high-k gate dielectric material portion 22P that are present in the isolated device region 102 have topmost surfaces that are coplanar with each other as well as coplanar with the isolated device region first sacrificial material portion 26R. As is shown, the second work function metal portion 24P and the second high-k gate dielectric material portion 22P may contact a sidewall of an outermost semiconductor structure 12 present in the dense device region 100.

Due to the loading effect mentioned above, the vertical gate channel length, L1, defined by the vertical height of the work function metal liner 25L is greater than the vertical gate channel length, L2, defined by the vertical height of the second work function metal portion 24P. Thus, and at this point of the present application, different vertical gate channel length VFETS would be formed in the different device regions (i.e., dense and isolated) due to the loading effect mentioned above.

Figure 7:
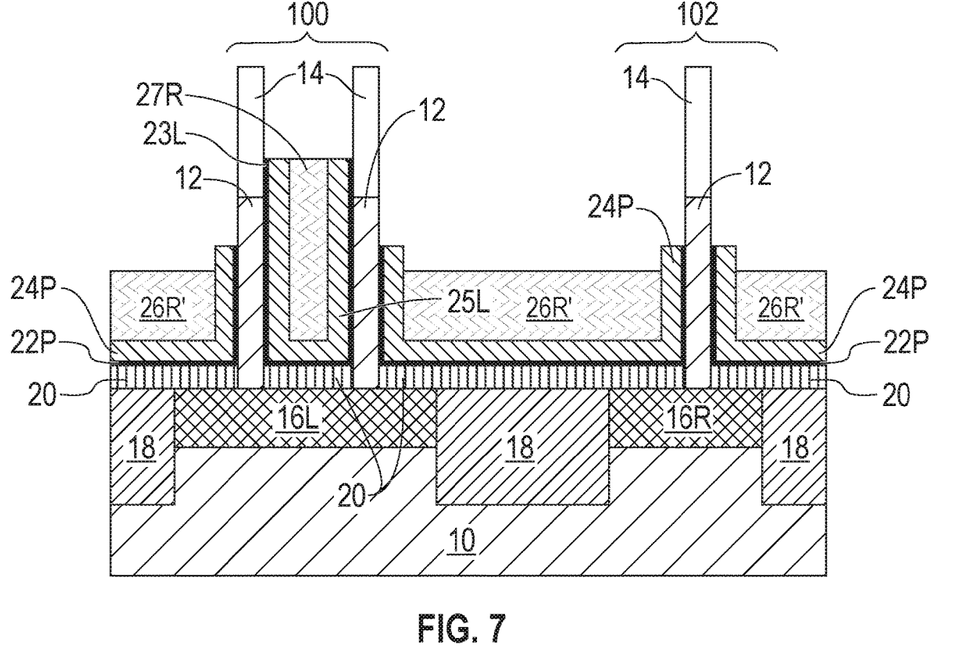
FIG. 7 is a cross sectional view of the exemplary semiconductor structure of FIG. 6 after recessing the recessed first sacrificial material in the isolated device region.

Referring now to FIG. 7, there is illustrated the exemplary semiconductor structure of FIG. 6 after recessing the recessed first sacrificial material (i.e., the isolated device region first sacrificial material portion 26R) in the isolated device region 102. Due to the tight spacing in the dense device region 100, this recessing step does not remove any significant amount of the dense device region first sacrificial material portion 27R from the structure.

The recessing of isolated device region first sacrificial material portion 26R includes a recess etch as defined above in recessing the first sacrificial material 26. After the recessing of the isolated device region first sacrificial material portion 26R, a portion of the isolated device region first sacrificial material portion 26R remains in the exemplary structure. The portion of the isolated device region first sacrificial material portion 26R that remains after the recess etch may be referred to herein as a modified isolated device region first sacrificial material portion 26R'. The modified isolated device region first sacrificial material portion 26R' has a vertical height that is now less than the vertical height of the second work function metal portion 24P and the vertical height of the second high-k gate dielectric material portion 22P.

Figure 8:
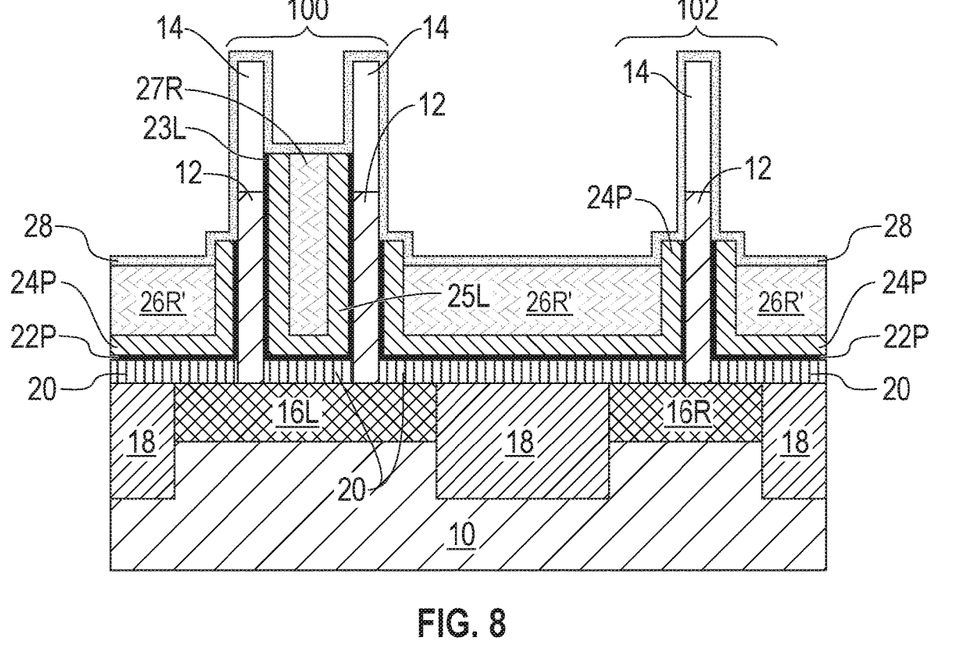
FIG. 8 is a cross sectional view of the exemplary semiconductor structure of FIG. 7 after forming a sacrificial high-k gate dielectric material layer.

Referring now to FIG. 8, there is illustrated the exemplary semiconductor structure of FIG. 7 after forming a sacrificial high-k gate dielectric material layer 28. The sacrificial high-k gate dielectric material layer 28 includes one of the high-k gate dielectric materials mentioned above for the high-k dielectric material layer 22 with the proviso that the sacrificial high-k gate dielectric material layer 28 is composed of a different high-k gate dielectric material than the high-k gate dielectric material layer 22.

The sacrificial high-k gate dielectric material layer 28 can be formed utilizing one of the deposition processes mentioned above in forming the high-k dielectric material layer 22. In some embodiments, the sacrificial high-k gate dielectric material layer 28 can have a thickness from 25 nm to 100 nm. Other thicknesses are possible for the thickness of the sacrificial high-k gate dielectric material layer 28 as long as the thickness of the sacrificial high-k gate dielectric material layer 28 does not fill in the gaps that is located between the densely packed semiconductor material structures 12 that are present in the dense device region 100 and, if present, the gaps that are present between the semiconductor material structures 12 that are present in the isolated device region 102. The sacrificial high-k gate dielectric material layer 28 is formed on all physically exposed surfaces of the exemplary structure shown in FIG. 7.

Figure 9:
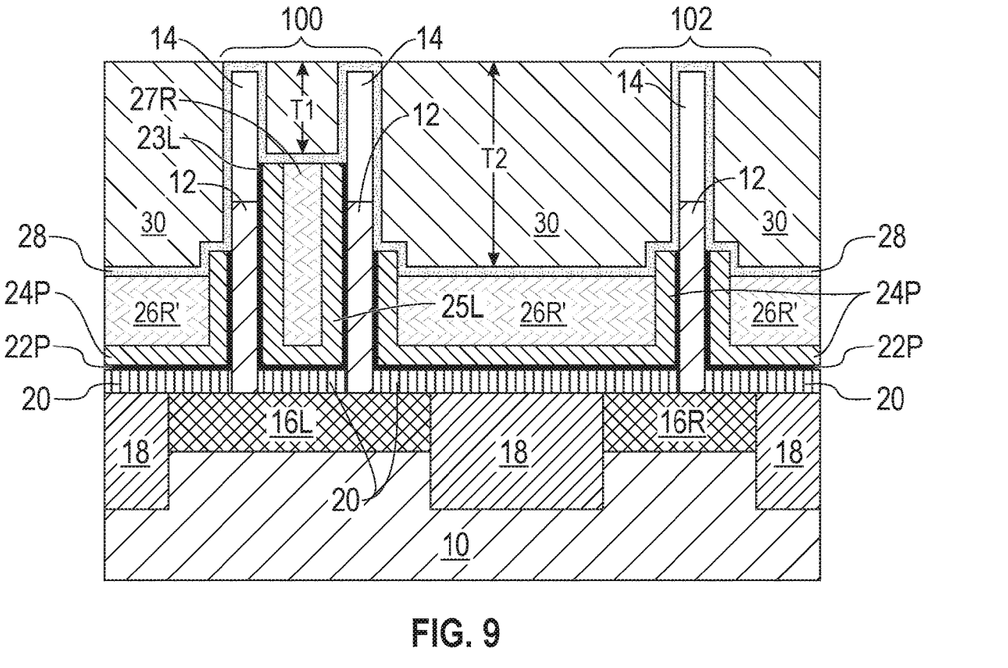
FIG. 9 is a cross sectional view of the exemplary semiconductor structure of FIG. 8 after forming a second sacrificial material in the gaps located between each semiconductor material structure.

Referring now to FIG. 9, there is illustrated the exemplary semiconductor structure of FIG. 8 after forming a second sacrificial material 30 in the gaps located between each semiconductor material structure 12. As is shown, the second sacrificial material 30 that is formed in the gaps between each semiconductor material structure 12 located in the dense device region 100 has a vertical thickness, T1, that is lesser than the vertical thickness, T2, of the second sacrificial material 30 that is formed in the isolated device region 102.

The second sacrificial material 30 includes a same dielectric material as mentioned above for the first sacrificial material 26 or a dielectric material that has a same etch rate as the first sacrificial material 26. The second sacrificial material 30 is however compositionally different from the sacrificial high-k gate dielectric material layer 28, the high-k gate dielectric material layer 22, and the dielectric hard mask caps 14. The second sacrificial material 30 can be formed utilizing a conventional deposition process including, for example, chemical vapor deposition (CVD), plasma enhanced chemical vapor deposition (PECVD) or spin-on coating. In some embodiments, a planarization process such as, for example, chemical mechanical polishing (CMP) may follow the deposition of the dielectric material that provides the second sacrificial material 30.

Figure 10:
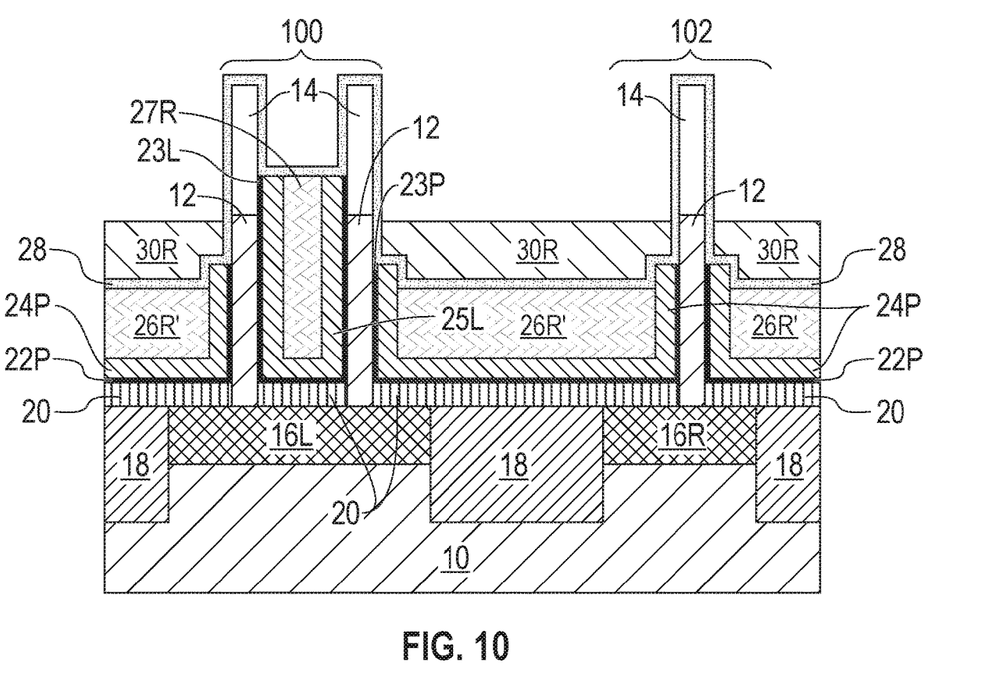
FIG. 10 is a cross sectional view of the exemplary semiconductor structure of FIG. 9 after recessing the second sacrificial material.

Referring now to FIG. 10, there is illustrated the exemplary semiconductor structure of FIG. 9 after recessing the second sacrificial material 30. The recessing of the second sacrificial material 30 can be performed utilizing a recess etch that is selective in removing the second sacrificial material 30. In accordance with the present application, this recessing step removes the entirety of the second sacrificial material 30 from the gaps between each semiconductor material structure 12 located in the dense device region 100, while only removing a portion of the second sacrificial dielectric material 30 in the isolated device region 102. The portion of the second sacrificial material 30 that remains is referred to herein as a second sacrificial material portion 30R. The second sacrificial material portion 30R has a height that is less than the height of each semiconductor material structure 12.

Figure 11:
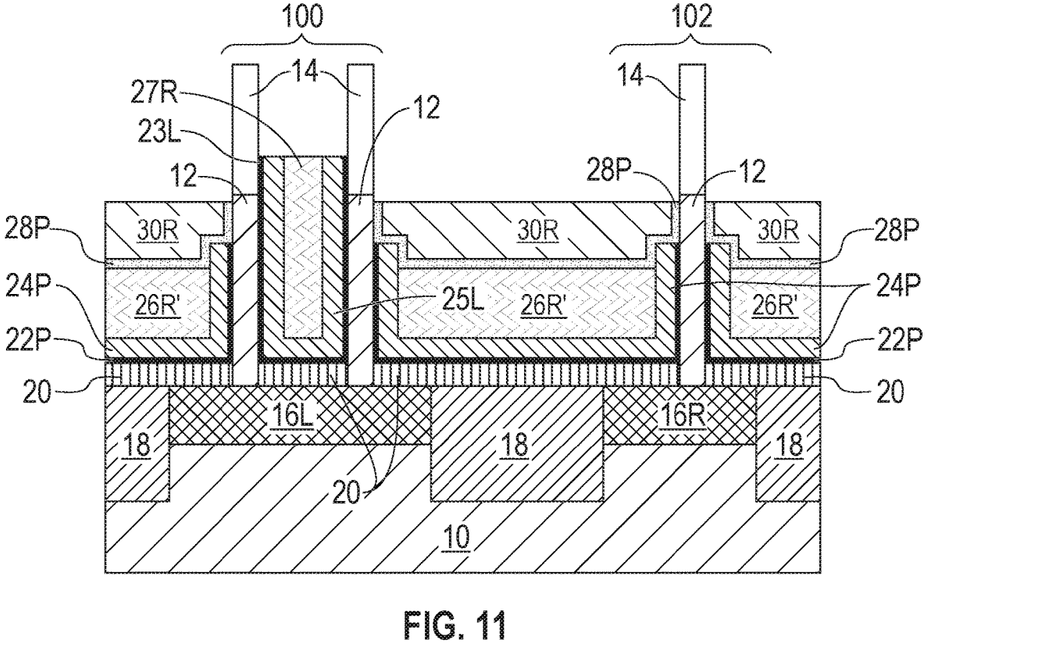
FIG. 11 is a cross sectional view of the exemplary semiconductor structure of FIG. 10 after removing physically exposed portions of the sacrificial high-k gate dielectric material layer not protected by the recessed second sacrificial material.

Referring now to FIG. 11, there is illustrated the exemplary semiconductor structure of FIG. 10 after removing physically exposed portions of the sacrificial high-k gate dielectric material layer 28 not protected by the recessed second sacrificial material (i.e., the second sacrificial material portion 30R). The removal of the physically exposed portions of the sacrificial high-k gate dielectric material layer 28 not protected by the second sacrificial material portion 30R can be performed utilizing an etching process that is selective for removing the sacrificial high-k gate dielectric material layer 28.

A portion of the sacrificial high-k gate dielectric material layer 28 remains beneath the second sacrificial material portion 30R. This remaining portion of the sacrificial high-k gate dielectric material layer 28 may be referred to as a sacrificial high-k gate dielectric material portion 28L. The sacrificial high-k gate dielectric material portion 28L has a topmost surface that is coplanar with a topmost surface of the second sacrificial material portion 30R. It is noted that the dense device region first sacrificial material portion 27R is now physically exposed.

Figure 12:
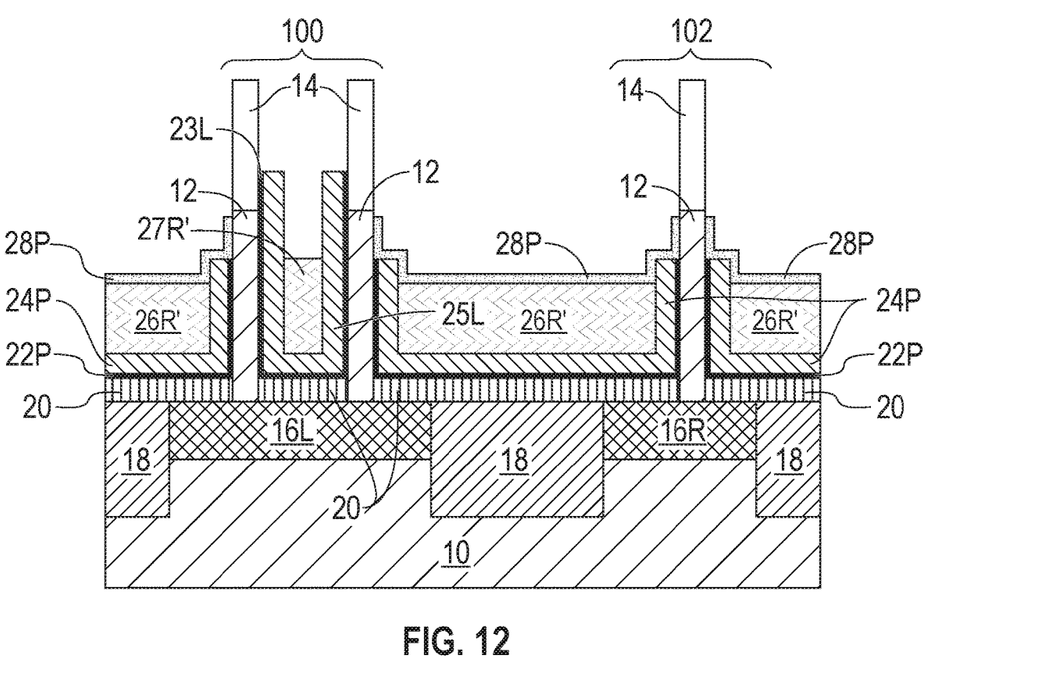
FIG. 12 is a cross sectional view of the exemplary semiconductor structure of FIG. 11 after removing the recessed second sacrificial material to physically expose the remaining portion of the sacrificial high-k gate dielectric material layer, while also adjusting the height of the remaining first sacrificial material that is present between the gaps of the semiconductor structures in the dense device region.

Referring now to FIG. 12, there is illustrated the exemplary semiconductor structure of FIG. 11 after removing the recessed second sacrificial material (i.e., the second sacrificial material portion 30R) to physically expose the remaining portion of the sacrificial high-k gate dielectric material layer (i.e., the sacrificial high-k gate dielectric material portion 28L), while also adjusting the height of the remaining first sacrificial material (i.e., the dense device region first sacrificial material portion 27R) that is present between the gaps of the semiconductor structures 12 in the dense device region 100.

The removal of the second sacrificial material portion 30R physically exposes the remaining portion of the sacrificial high-k gate dielectric material layer 28 (i.e., the sacrificial high-k dielectric material portion 28L). During this removal step and as mentioned above, a portion of the dense device region first sacrificial material portion 27R is also removed to provide a modified dense device region first sacrificial material portion 27R'. The modified dense device region first sacrificial material portion 27R' has a topmost surface that is substantially coplanar (within ±5%) with topmost surfaces of the second work function metal portion 24P and the second high-k gate dielectric material portion 22P.

The removal of the second sacrificial material portion 30R and the removal of a portion of the dense device region first sacrificial material portion 27R can be performed utilizing an etching process that is selective in removing the material(s) that provides the first and second sacrificial material 26, 30 of the present application. As is shown, an upper portion of the work function metal liner 25L in the gaps between the semiconductor material structures 12 in the dense device region 100 is now physically exposed.

Figure 13:
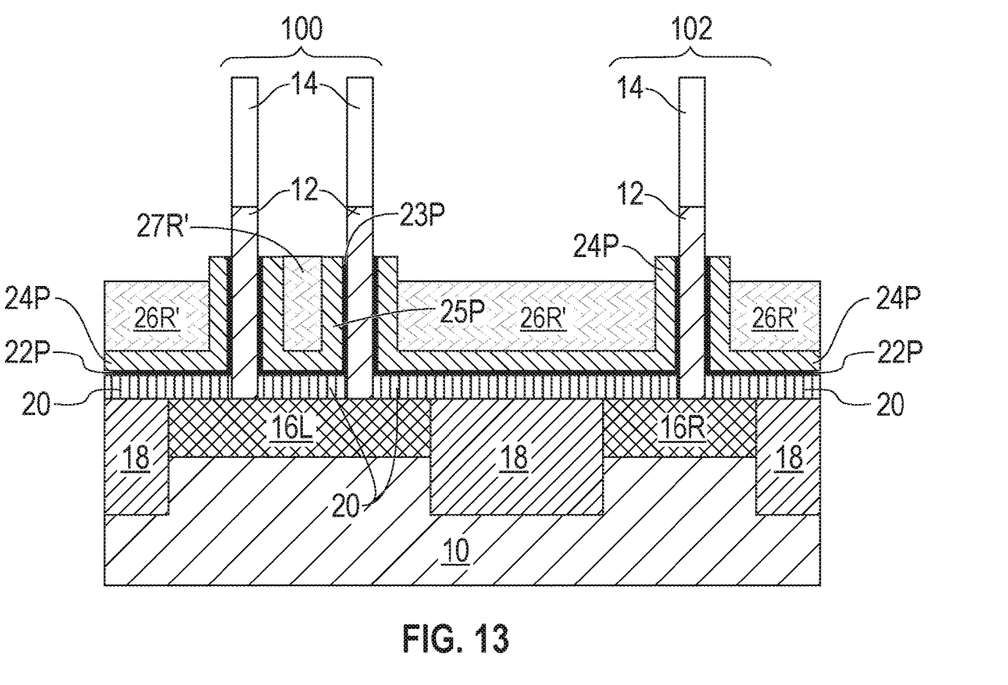
FIG. 13 is a cross sectional view of the exemplary semiconductor structure of FIG. 12 after adjusting the vertical height of the remaining work function metal layer and the remaining high-k gate dielectric material layer that is present between the gaps of the semiconductor structures in the dense device region, and removing the physically exposed remaining portion of the sacrificial high-k gate dielectric material layer.

Referring now FIG. 13, there is illustrated the exemplary semiconductor structure of FIG. 12 after adjusting the vertical height of the remaining work function metal layer (i.e., the work function metal liner 25L) and the remaining high-k gate dielectric material layer (i.e., the high-k gate dielectric material liner 23L) that is present between the gaps of the semiconductor structures 12 in the dense device region 100, and removing the physically exposed remaining portion of the sacrificial high-k gate dielectric material layer (i.e., the sacrificial high-k gate dielectric material portion 28P).

The adjustment of the vertical height of the work function metal liner 25L and the high-k gate dielectric material liner 23L that is present between the gaps of the semiconductor structures 12 in the dense device region 100 includes one or more isotropic etching processes. In one example, one or more reactive ion etching processes can be used to adjust the vertical height of the work function metal liner 25L and the high-k gate dielectric material liner 23L that is present between the gaps of the semiconductor structures 12 in the dense device region 100. The sacrificial high-k gate dielectric material portion 28P acts an etch mask during this step of the present application.

A reduced vertical height portion of the work function metal liner 25L and a reduced vertical height portion of the high-k gate dielectric material liner 23L remain after this step of the present application The reduced vertical height portion of the work function metal liner 25L may be referred to as a first work function metal portion 25P. The reduced vertical portion of the high-k gate dielectric material liner 23L may be referred to as a first high-k gate dielectric material portion 23P.

As is shown, the first work function metal portion 25P and the first high-k gate dielectric material portion 23P that are located in the gaps between the semiconductor material structures 12 that are present in the dense device region 100 are U-shaped and have topmost surfaces that are coplanar with each other as well as substantially coplanar (within ±5%) with the second work function metal portion 24P and the second high-k gate dielectric material portion 22P that are present in the isolated device region 102. In the present application, the first work function metal portion 25P and the first high-k gate dielectric material portion 23P collectively define a first gate structure, while the second work function metal portion 24P and the first high-k gate dielectric material portion 22P collectively define a second gate structure. As is shown, an end portion of the second gate structure (22P, 24P) can contact a sidewall of an outermost semiconductor structure 12 present in the dense device region 100.

The vertical gate channel length, Lg1, defined by the vertical height of the first work function metal portion 25P is now substantially equal to (within ±5%) the vertical gate channel length, Lg2, defined by the vertical height of the second work function metal portion 24P. This is clearly shown in FIG. 16 of the present application.

The sacrificial high-k gate dielectric material portion 28P can be removed utilizing an etching process that is selective in removing the dielectric material that provides the sacrificial high-k gate dielectric material portion 28P. After removing the sacrificial high-k gate dielectric material portion 28P from the exemplary structure, the remaining first sacrificial material (26R', 27R') is physically exposed.

Figure 14:
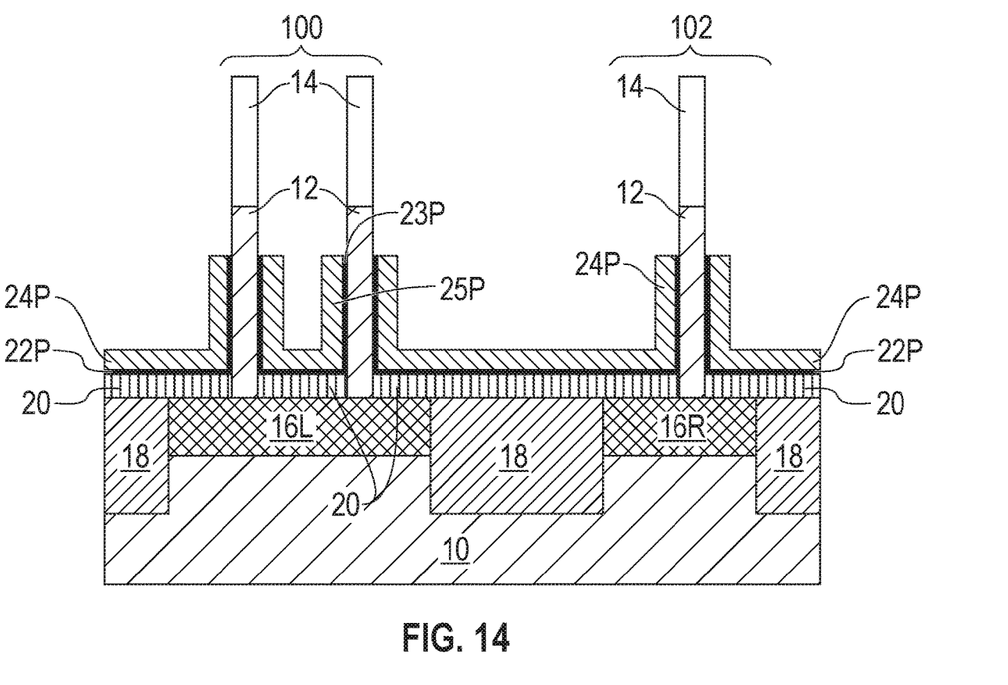
FIG. 14 is a cross sectional view of the exemplary semiconductor structure of FIG. 13 after removing any remaining first sacrificial material from the structure.

Referring now to FIG. 14, there is illustrated the exemplary semiconductor structure of FIG. 13 after removing any remaining first sacrificial material (26R', 27R') from the structure. The remaining first sacrificial material (26R', 27R') can be removed utilizing an etching process that is selective for removing the first sacrificial material.

Figure 15:
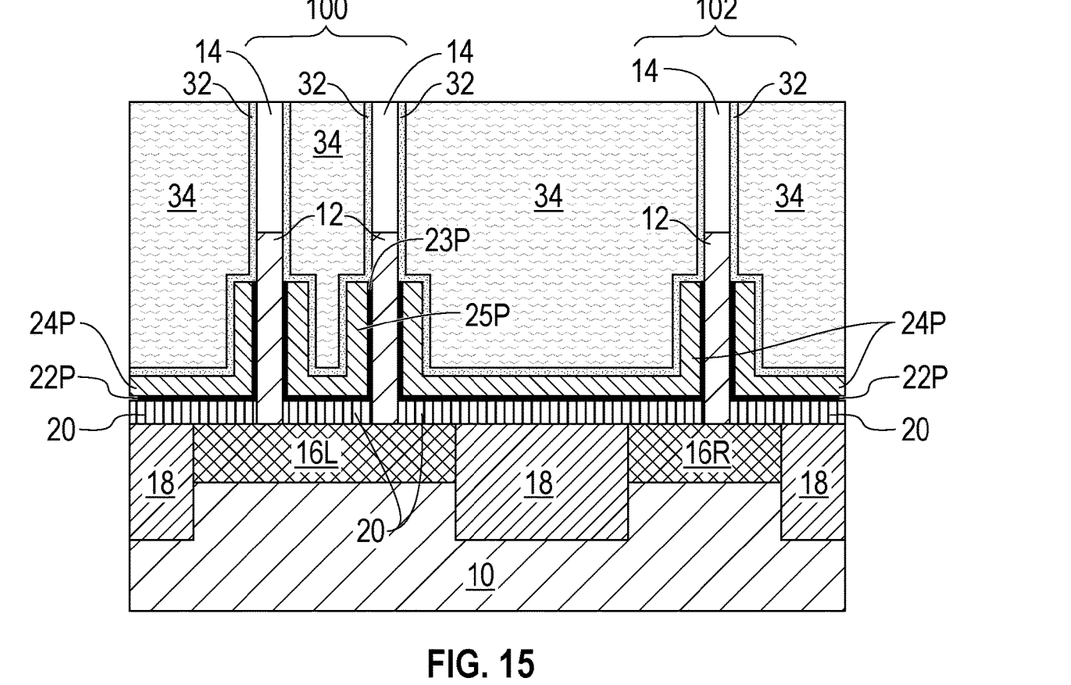
FIG. 15 is a cross sectional view of the exemplary semiconductor structure of FIG. 14 after forming a passivation layer and an interlayer dielectric (ILD) material.

Referring now to FIG. 15, there is illustrated the exemplary semiconductor structure of FIG. 14 after forming a passivation layer 32 and an interlayer dielectric (ILD) material 34 laterally surrounding each semiconductor structure 12.

The passivation layer 32 includes a dielectric material such as, for example, silicon nitride. The passivation layer 32 typically is composed of a dielectric material that is compositionally different from each dielectric hard mask 14. The passivation layer 32 can be formed utilizing a conventional deposition process such as, for example, chemical vapor deposition (CVD), plasma enhanced chemical vapor deposition (PECVD), or physical vapor deposition. A planarization process may follow the deposition process to provide the passivation layer 15 shown in FIG. 15.

The ILD material 34 is composed of a dielectric material which differs in composition from either the passivation layer 32 and the dielectric hard mask caps 14. The ILD material 34 can be composed of, for example, silicon dioxide, undoped silicate glass (USG), fluorosilicate glass (FSG), borophosphosilicate glass (BPSG), a spin-on low k dielectric layer, a chemical vapor deposition (CVD) low-k dielectric layer or any combination thereof. In another embodiment, a self-planarizing material such as a spin-on glass (SOG) or a spin-on low-k dielectric material such as SiLK™ can be used as the ILD material 34; the term "low-k" denotes a dielectric material having a dielectric constant of less than 4.0. In one embodiment, ILD material 34 can be formed utilizing a deposition process including, for example, chemical vapor deposition (CVD), plasma enhanced chemical vapor deposition (PECVD), evaporation or spin-on coating. Following deposition of ILD material 34, a planarization process such as, for example, chemical mechanical polishing (CMP), can employed. As is shown, the ILD material 34 has a topmost surface that is coplanar with a topmost surface of the passivation layer 32 and each dielectric hard mask cap 14.

Figure 16:
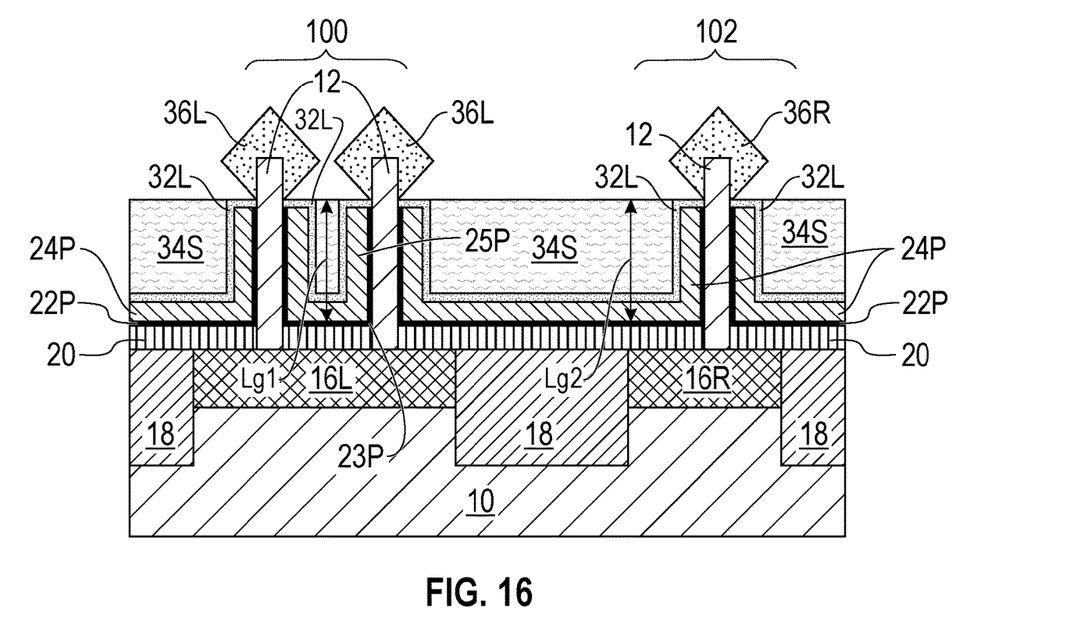
FIG. 16 is a cross sectional view of the exemplary semiconductor structure of FIG. 15 after physically exposing a surface of each semiconductor material structure and forming a top S/D structure on the physically exposed surface of each semiconductor material structure.

Referring now to FIG. 16, there is illustrated the exemplary semiconductor structure of FIG. 15 after physically exposing a surface of each semiconductor material structure 12 and forming a top S/D structure (36L, 36R) on the physically exposed surface of each semiconductor material structure 12. In some embodiments, and as shown, an upper portion of the sidewall and the topmost surface of each semiconductor structure 12 are physically exposed.

The physically exposing of a surface of each semiconductor material structure 12 includes recessing the ILD material to provide an ILD structure 34S, recessing the passivation layer 32 to provide a passivation liner 32L and removing each dielectric material 14. The recessing of the ILD material includes a recess etching process that is selective in removing ILD material. The recessing of the passivation layer 32 includes a recess etching process that is selective in removing the passivation material. The removal of each dielectric hard mask 14 may include chemical mechanical polishing (CMP) or another recess etching process that is selective in removing dielectric hard mask material.

The top S/D structure (36L, 36R) can be formed utilizing an epitaxial growth (or deposition) process, as defined above. A laser drive-in anneal is performed after the epitaxial growth process; a laser drive-in anneal prevents excess diffusion of dopants at the bottom S/D structure (16L, 16R). The dopants within the top S/D structure (36L, 36R) are typically introduced during the epitaxial growth process.

The top S/D structure (36L, 36R) includes a semiconductor material (as defined above) and an n-type dopant (as also defined above) or a p-type dopant (as also defined above). The semiconductor material that provides the top S/D structure (36L, 36R) can be compositionally the same as, or compositionally different from, the semiconductor material that provides the bottom S/D structure (16L, 16R) and/or the semiconductor material structures 12. The concentration of dopant within the semiconductor material that provides the top S/D structure (36L, 36R) can range from $1\times10^{18}$ atoms/$cm^3$ to $1\times10^{21}$ atoms/$cm^3$, although dopant concentrations greater than $1\times10^{21}$ atoms/$cm^3$ or less than $1\times10^{18}$ atoms/$cm^3$ are also conceived. The top S/D structure (36L, 36R) 8 can have a non-faceted surface or a faceted surface. In one embodiment and as shown in the drawings, the top S/D structure (36L, 36R) is diamond-shaped.

In the present application, element 36L designates the top S/D structure that contacts a surface of a semiconductor material structure 12 that is present in the dense device region 100, while element 36R designates the top S/D structure that contacts a surface of a semiconductor material structure 12 present in the isolated device region 102. In some embodiments, top S/D structure 36L present in the dense device region 100 is of the same conductivity type as the top S/D structure 36R present in the isolated device region 102. In other embodiments, top S/D structure 36L present in the dense device region 100 is of a different conductivity type than the top S/D structure 36R present in the isolated device region 102.

FIG. 16 illustrates an exemplary semiconductor structure of the present application in which the vertical gate channel length is substantially the same for vertical field effect transistors (VFETs) that are present in a dense device region and an isolated device region. Notably, the semiconductor structure illustrated in FIG. 16 includes a first VFET including a first gate structure (23P, 25P) having a first vertical gate channel length, Lg1, and contacting a sidewall of each semiconductor material structure 12 that is present in a dense device region 100 of a semiconductor substrate 100. A second VFET is present that includes a second gate structure (22P, 24P) having a second vertical gate channel length, Lg2, substantially equal to the first vertical gate channel length, Lg1, and contacting a sidewall of each semiconductor material structure 12 that is present in an isolated device region 102 of the semiconductor substrate 10.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a first vertical field effect transistor comprising a first gate structure having a first vertical gate channel length and contacting a sidewall of each semiconductor material structure that is present in a dense device region of a semiconductor substrate;
a second vertical field effect transistor comprising a second gate structure having a second vertical gate channel length substantially equal to the first vertical gate channel length and contacting a sidewall of each semiconductor material structure that is present in an isolated device region of the semiconductor substrate;
a passivation liner contacting the first gate structure and the second gate structure, wherein the passivation liner further directly contacts a sidewall of each semiconductor material structure that is present in both the dense device region and in the isolated device region; and
an interlayer dielectric material structure contacting the passivation liner and laterally surrounding each semiconductor material structure, wherein each semiconductor material structure in the dense device region and the isolated device region is entirely composed of a semiconductor material, and further wherein the interlayer dielectric material structure has a topmost surface that is coplanar with a topmost surface of the passivation liner and the topmost surface of both the interlayer dielectric structure and the passivation liner is located entirely beneath a topmost surface of each semiconductor material structure.

2. The semiconductor structure of claim 1, further comprising a first bottom source/drain (S/D) structure beneath each semiconductor material structure present in the dense device region, and a second bottom S/D structure beneath each semiconductor material structure present in the isolated device region.

3. The semiconductor structure of claim 2, further comprising first top S/D structures contacting each semiconductor material structure present in the dense device region, and second top S/D structures contacting each semiconductor material structure present in the isolated device region.

4. The semiconductor structure of claim 2, further comprising a bottom spacer layer located on the first and second S/D structures and contacting a lower portion of the sidewall of each semiconductor material structure that is present in both the dense device region and the isolated device region.

5. The semiconductor structure of claim 1, wherein each semiconductor material structure present in the dense device region is spaced apart from a nearest neighboring semiconductor material structure by a pitch from 20 nm to 100 nm, and wherein each semiconductor material structure present in the isolated device region is spaced apart from a nearest neighboring semiconductor material structure by a pitch of greater than 100 nm.

6. The semiconductor structure of claim 1, wherein a portion of the second gate structure contacts the sidewall of an outermost semiconductor material structure present in the dense device region.

7. The semiconductor structure of claim 1, further comprising an isolation structure present in the semiconductor substrate and separating the dense device region from the isolated device region.

8. The semiconductor structure of claim 1, wherein the first gate structure comprises a first high-k gate dielectric material portion and a first work function metal portion, and the second gate structure comprises a second high-k gate dielectric material portion and a second work function metal portion, and the passivation liner extends onto a topmost surface of each of the first high-k gate dielectric material portion, the first work function metal portion, the second high-k gate dielectric material portion, the second work function metal portion.

9. The semiconductor structure of claim 8, wherein the first and second high-k gate dielectric material portions are composed of a compositionally same high-k gate dielectric material, and wherein the first and second work function metal portions are composed of a compositionally same work function metal.

10. The semiconductor structure of claim 8, wherein the first and second high-k gate dielectric material portions are composed of a compositionally same high-k gate dielectric material, and wherein the first work function metal portion is composed of a work function metal that is compositionally different from a work function metal that provides the second work function metal portion.

* * * * *